United States Patent
Davison

(10) Patent No.: US 8,035,956 B2
(45) Date of Patent: Oct. 11, 2011

(54) BULKHEAD MOUNT EQUIPMENT SHELF RACK TRAY

(75) Inventor: John Edward Davison, Arlington, WA (US)

(73) Assignee: The Boeing Company, Chicago, IL (US)

( * ) Notice: Subject to any disclaimer, the term of this patent is extended or adjusted under 35 U.S.C. 154(b) by 593 days.

(21) Appl. No.: 12/234,390

(22) Filed: Sep. 19, 2008

(65) Prior Publication Data

US 2010/0073899 A1    Mar. 25, 2010

(51) Int. Cl.
- G06F 1/16    (2006.01)
- G06F 1/20    (2006.01)
- H05K 5/00    (2006.01)
- H05K 7/00    (2006.01)

(52) U.S. Cl. .................. 361/679.02; 174/50; 361/679.49; 312/223.1

(58) Field of Classification Search .............. 361/679.01, 361/679.02, 679.33, 679.37, 724–727, 679.46, 361/679.48, 679.49, 688; 312/223.1, 223.2, 312/333, 334; 174/50
See application file for complete search history.

(56) References Cited

U.S. PATENT DOCUMENTS

| | | | | |
|---|---|---|---|---|
| 3,771,023 A * | 11/1973 | Hollingsead et al. | ......... | 361/691 |
| RE28,171 E * | 9/1974 | Anhalt | ........................... | 439/261 |
| 3,853,379 A * | 12/1974 | Goodman et al. | ............ | 439/261 |
| 3,977,749 A * | 8/1976 | Langenbach | .................. | 439/261 |
| 4,044,515 A * | 8/1977 | Hollingsead et al. | .......... | 277/642 |
| 4,236,190 A * | 11/1980 | Hollingsead et al. | ......... | 361/725 |
| 4,458,296 A * | 7/1984 | Bryant et al. | .................. | 361/691 |
| 4,766,517 A * | 8/1988 | Abell | ............................. | 361/691 |
| 4,845,591 A * | 7/1989 | Pavie | ............................. | 361/726 |
| 5,129,594 A * | 7/1992 | Pease | ............................. | 244/1 R |
| 5,170,320 A * | 12/1992 | Pease | ............................. | 361/690 |
| 5,190,241 A * | 3/1993 | Pease | ............................. | 244/1 R |
| 5,400,217 A * | 3/1995 | Whitson et al. | ............... | 361/695 |
| 5,431,582 A * | 7/1995 | Carvalho et al. | ............. | 439/372 |
| 5,457,607 A * | 10/1995 | Carvalho | ...................... | 361/740 |
| 5,725,622 A * | 3/1998 | Whitson et al. | ............... | 55/385.4 |
| 5,930,428 A * | 7/1999 | Irwin et al. | ...................... | 385/88 |
| 6,450,822 B1 * | 9/2002 | Eller | ............................. | 439/248 |
| 6,797,879 B2 * | 9/2004 | Leyda et al. | .................... | 174/50 |
| 6,963,490 B2 * | 11/2005 | McClary | ....................... | 361/704 |
| 6,967,830 B2 * | 11/2005 | Cooper et al. | ........... | 361/679.32 |
| 7,170,747 B2 * | 1/2007 | Muirhead et al. | ............. | 361/715 |
| 7,535,717 B2 * | 5/2009 | Lai et al. | ........................ | 361/727 |
| 7,736,185 B2 * | 6/2010 | Rotta et al. | ............... | 439/607.41 |
| 2004/0050569 A1 * | 3/2004 | Leyda et al. | ..................... | 174/50 |
| 2004/0201967 A1 * | 10/2004 | Muirhead et al. | ............. | 361/716 |
| 2005/0047065 A1 * | 3/2005 | Cooper et al. | ................ | 361/679 |
| 2006/0043238 A1 * | 3/2006 | Inam et al. | .................. | 244/129.1 |
| 2006/0234787 A1 * | 10/2006 | Lee et al. | ................... | 455/575.7 |
| 2009/0298335 A1 * | 12/2009 | Rotta et al. | ............... | 439/607.01 |

* cited by examiner

Primary Examiner — Jinhee Lee
Assistant Examiner — Adrian S Wilson
(74) Attorney, Agent, or Firm — Felix L. Fischer

(57) ABSTRACT

A Line Replaceable Unit (LRU) support system incorporates a unitary tray having a rear boss and an integral Air Cooling System (ACS) plenum and an ACS conduit through the rear boss communicating with the plenum. A tray support and alignment element provides a flange with tray attachment studs extending from a front surface, wall attachment studs extending from a rear surface, and an ACS aperture. The wall attachment studs are received in spaced holes in a mounting structure and the tray attachment studs are received in bores in the rear boss of the tray. Insertion of the tray attachment studs aligns the ACS conduit in the rear boss and the ACS aperture in the flange. A backing plate engages the wall attachment studs to secure the tray support and alignment element to the mounting structure. The backing plate includes an ACS spud aligned with the ACS aperture.

20 Claims, 17 Drawing Sheets

BULKHEAD MOUNT EQUIPMENT SHELF RACK TRAY

BACKGROUND OF THE INVENTION

1. Field of the Invention

Embodiments of the disclosure relate generally to the field of avionics and electrical equipment mounting in aircraft and more particularly to an apparatus for support for Line Replaceable Unit (LRU) installations with a one piece cantilevered tray mounted on a bulkhead or support fitting.

2. Description of the Related Art

Mounting and support of LRUs in current commercial aircraft requires a myriad of parts, fasteners, extrusions, seals, sheet metal plenums, slip joints and stanchions. Standard mounting structures and wiring installations for LRUs are currently the same as have been used on commercial airplanes since the introduction of jet transport aircraft. Similar mounting concepts are employed in a variety of ships and vehicles where LRUs are regularly employed for interchangeability and ease of maintenance and upgrade.

It is therefore desirable to provide a system which simplifies the mounting and support of LRUs with an integrated system providing support and cooling with reduced weight volume and part count.

It is further desirable to provide a system for mounting of LRUs with reduced maintenance cost and reliability.

SUMMARY OF THE INVENTION

Exemplary embodiments provide a Line Replaceable Unit (LRU) support system incorporates a unitary tray having a rear boss and an integral Air Cooling System (ACS) plenum and an ACS conduit through the rear boss communicating with the plenum. A tray support and alignment element provides a flange with tray attachment studs extending from a front surface, wall attachment studs extending from a rear surface, and an ACS aperture. The wall attachment studs are received in spaced holes in a mounting structure and the tray attachment studs are received in bores in the rear boss of the tray. Insertion of the tray attachment studs aligns the ACS conduit in the rear boss and the ACS aperture in the flange. A backing plate engages the wall attachment studs to secure the tray support and alignment element to the mounting structure. The backing plate includes an ACS spud aligned with the ACS aperture.

In an exemplary embodiment, the LRU support system tray includes rails on side edges to engage bottom edges of an LRU box supported by the tray. The tray support and alignment element additionally includes positioning brackets extending vertically from the flange and having reliefs to engage vertical rear edges of an LRU box supported by the tray to urge the box into precise alignment for engagement of connectors on the box and mounting structure.

The embodiments disclosed provide a method for mounting LRUs in a vehicle using the tray having a rear mounting boss, the tray support and alignment element with tray and wall mounting studs and the backing plate, each with integral ACS flow capability. Spaced holes are provided to accommodate the wall attachment studs in the associated mounting structure. The tray support and alignment element is mounted to the panel by insertion of the wall attachment studs into the spaced holes and securing of the backing plate. A flexible ACS conduit is attached to the spud to supply cooling air for the LRU box. The tray is mounted by inserting the tray attachment studs into the mating bores in the tray rear boss and securing threaded fasteners through the flange into threaded inserts in the rear boss. The LRU box is placed on the tray with the bottom corners engaged by tray rails and then slid rearwardly for the lower portions of the rear edges of the box to be received by angle reliefs in positioning brackets on the tray support and alignment element urging the box into precise alignment for the connectors. Continued rearward motion seats the connectors and the box is secured to the tray using knurled engagement nuts secured over engagement angles on the box.

BRIEF DESCRIPTION OF THE DRAWINGS

The features and advantages of embodiments disclosed herein will be better understood by reference to the following detailed description when considered in connection with the accompanying drawings wherein.

DETAILED DESCRIPTION OF THE INVENTION

Figure 1:
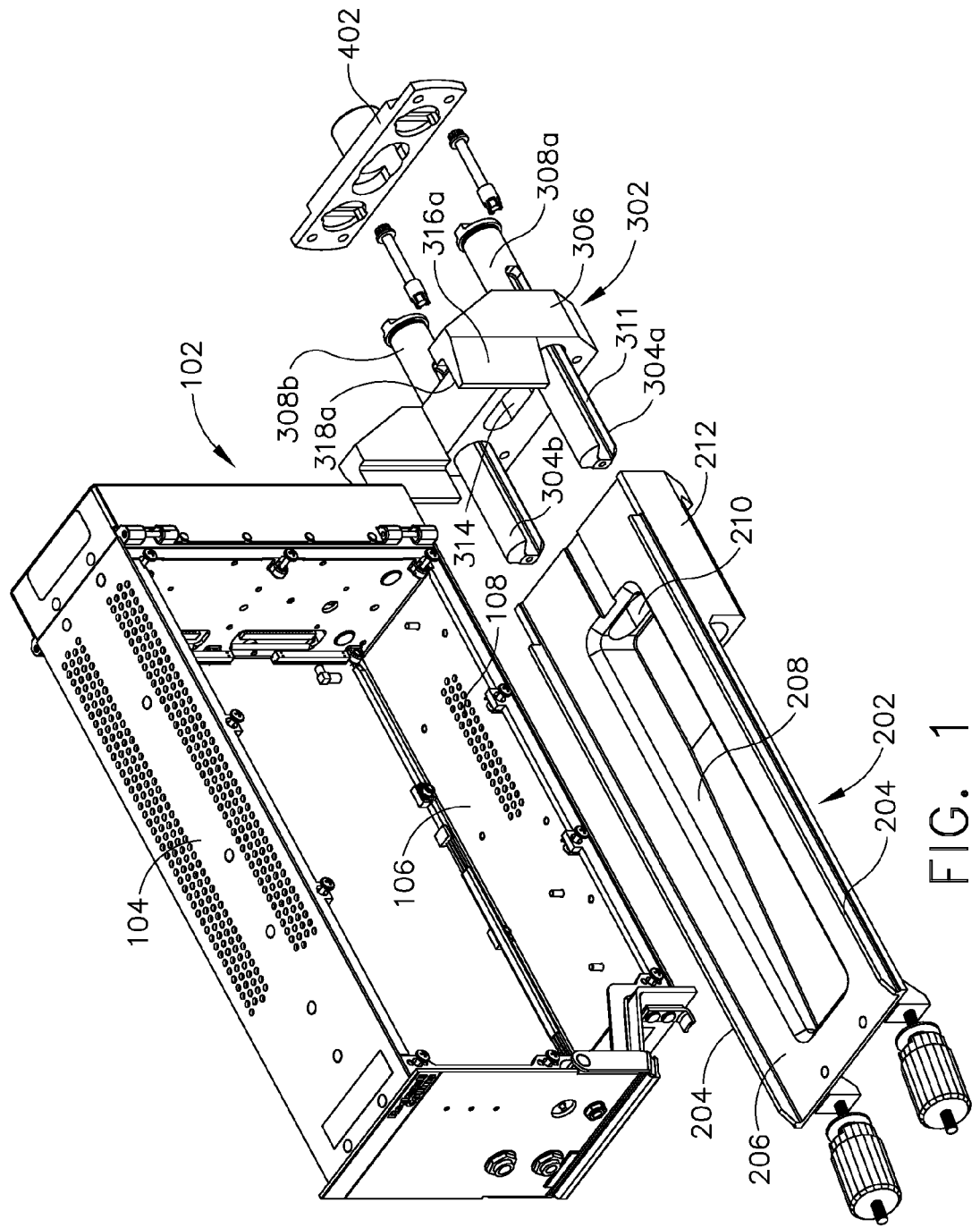
FIG. 1 is an isometric exploded view of a first embodiment with an exemplary LRU box.
Figure 2A:
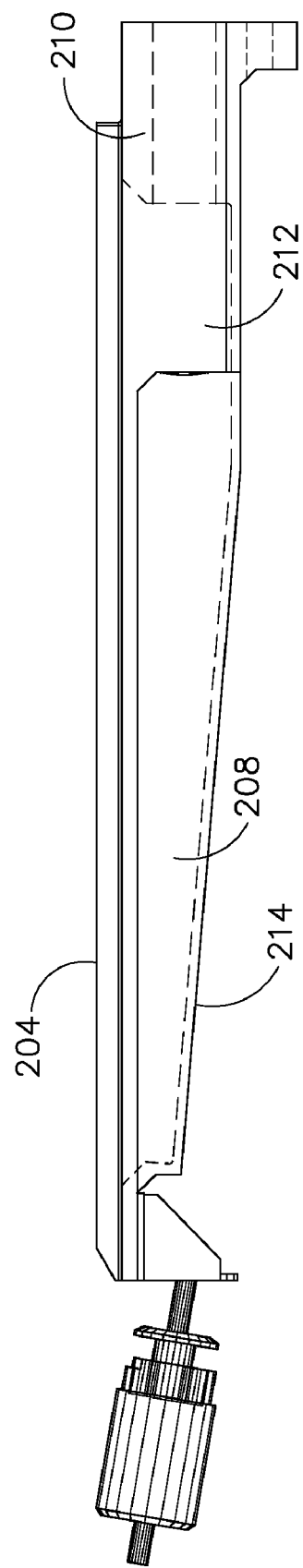
FIG. 2A is a side view of the LRU tray with the integrated air plenum shown in phantom.
Figure 2B:
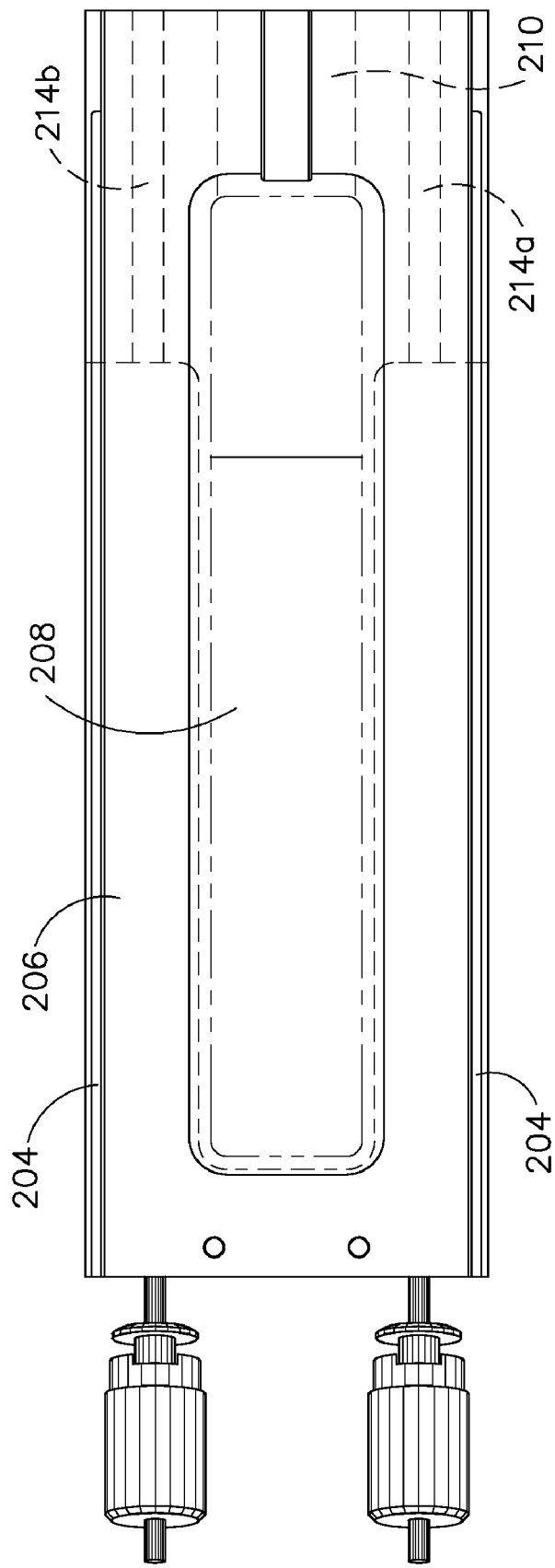
FIG. 2B is a top view of the tray.
Figure 2C:
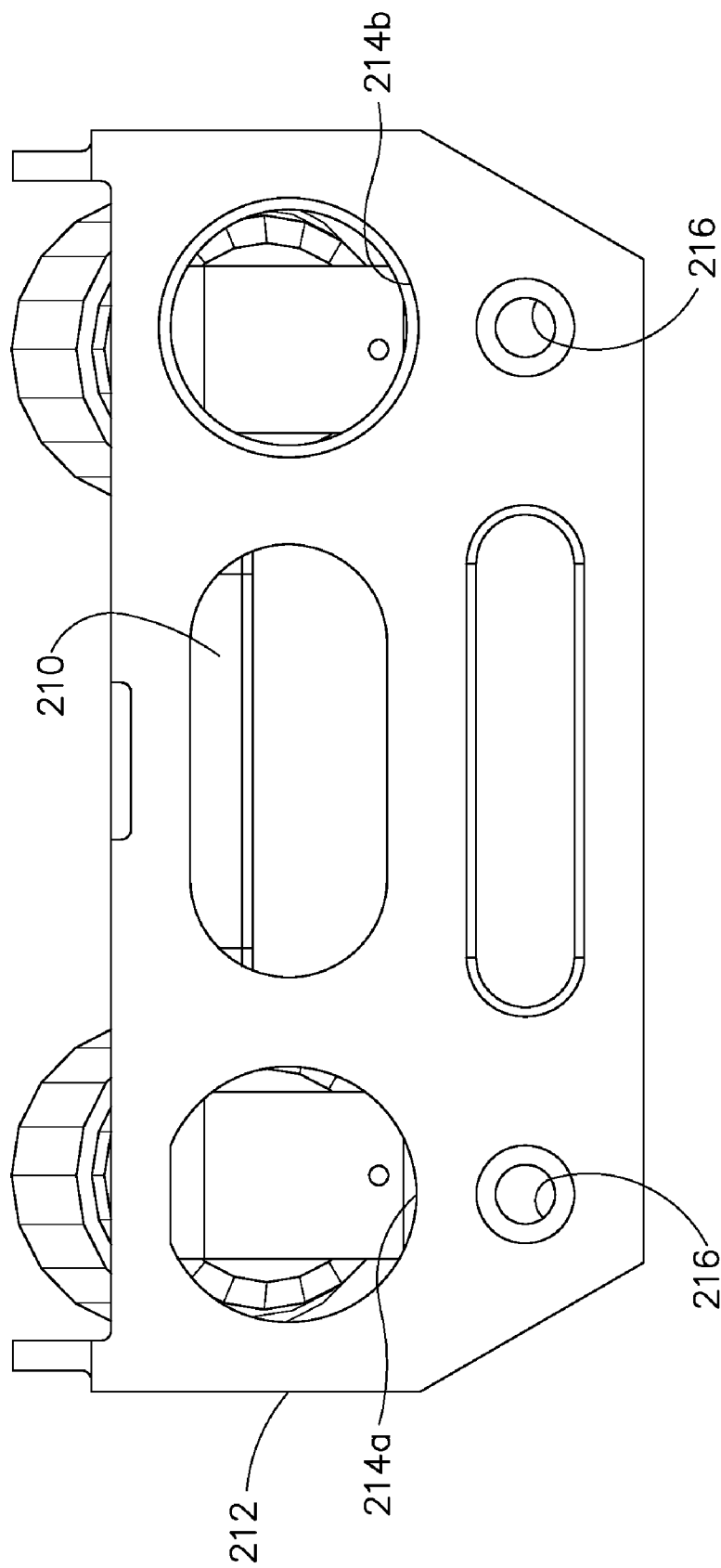
FIG. 2C is a rear view of the tray with the LRU box mounted.
Figure 3A:
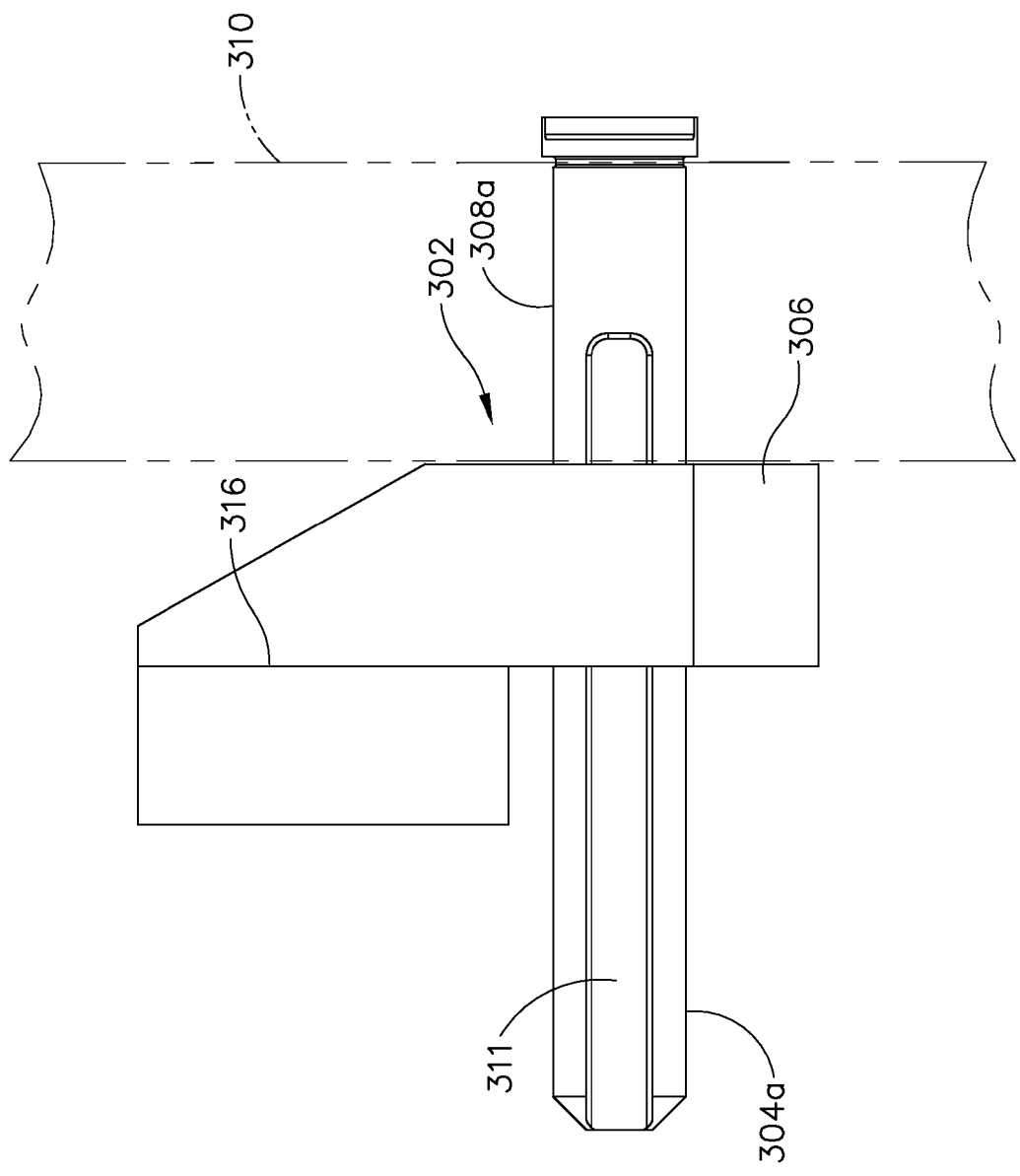
FIG. 3A is a side view of the tray support and alignment element.
Figure 3B:
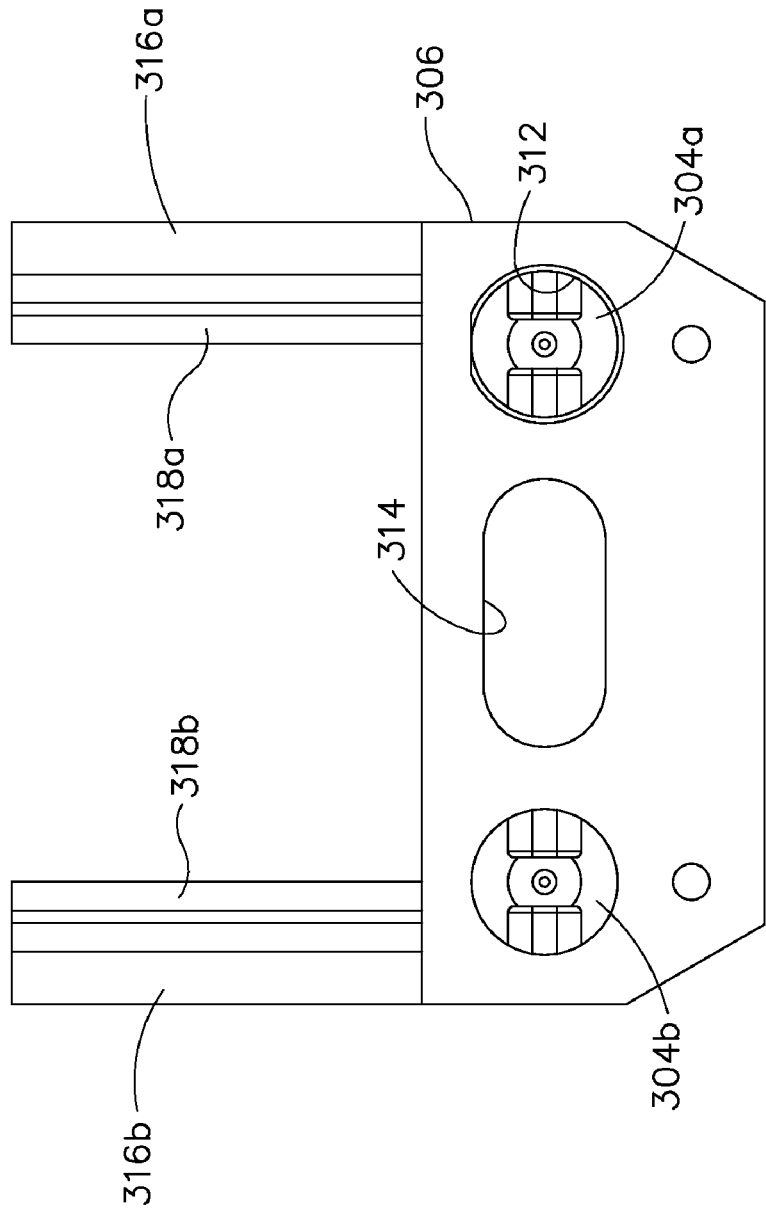
FIG. 3B is a top view of the tray support and alignment element.
Figure 3C:
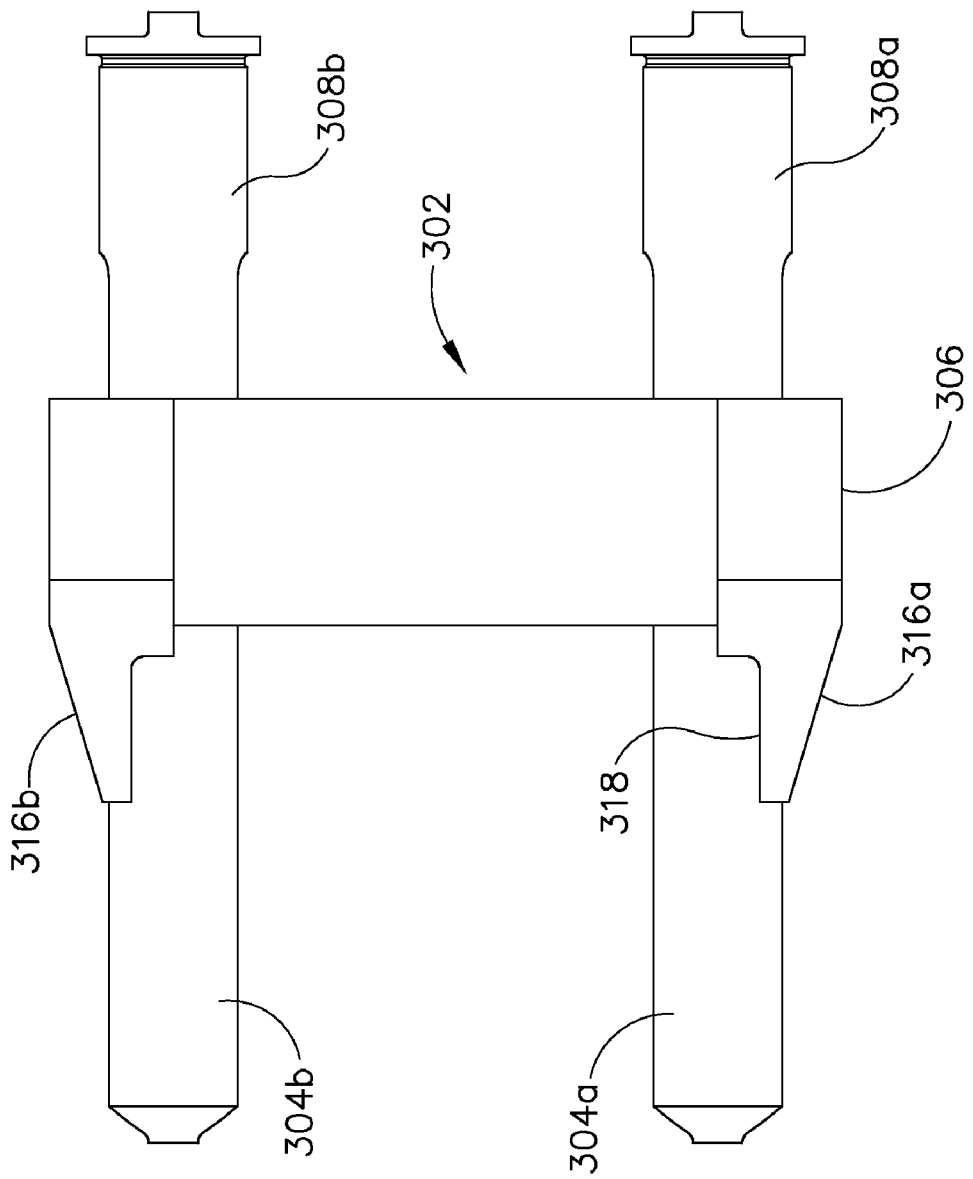
FIG. 3C is a front view of the tray support and alignment element.

An embodiment of a bulkhead mount equipment shelf rack tray disclosed herein is generally shown in FIG. 1 and in detail in FIGS. 2A through 3C. As shown in FIG. 1, a typical LRU box 102 is sized to contain, structurally support and interconnect printed circuit boards and other system components for a particular LRU. The top 104 and bottom 106 of the box employ perforations 108 for cooling air flow as will be described in greater detail subsequently. Internal connectors 110 for the circuit boards/components in the box are wired or otherwise interconnected to box mating connectors 112 (shown in detail in FIG. 2B).

As shown in FIGS. 1 and 2A-2C, the LRU tray 202 is a unitary element with an integrated structure sized to receive and constrain the bottom of the LRU box. For the embodiment shown, side rails 204 constrain the bottom corners of the box while support surface 206 engages the bottom of the box. An integrated Air Cooling System (ACS) plenum 208 provides cooling air through the tray to the LRU box for flow into the perforations in the bottom wall of the box previously described. An integrated ACS conduit 210 is provided through a rear boss 212 of the tray. For the embodiment shown, the tray is stamped, cast or molded with the external wall 214 of the plenum providing, in combination with the rear boss and rails, bending rigidity for the tray support surface. For the exemplary embodiment shown in the drawing, the tray is cast aluminum.

The tray support and alignment element 302 shown in FIGS. 1 and 3A-3C provides connection for the LRU tray to the structure of an aircraft, vehicle or other system in which the LRU is employed. Tray attachment studs 304a and 304b extend from a mounting flange 306 to engage the tray. For the embodiment shown, the attachment studs are modified I-beam shape in cross section for enhanced rigidity with weight reduction and are received in mating bores 214a and 214b in the rear boss of the tray (best seen in FIG. 2C). Length and cross section of the studs and mating bores is determined based on the weight and length of the LRU box exerting cantilever forces on the tray. Opposing wall attachment studs 308a and 308b extend from the mounting flange opposite the tray attachment studs to attach the tray support and alignment element to a bulkhead or equipment rack surface such as a waffle panel 310 (shown in phantom in FIG. 3A as an example and described in greater detail with respect to an alternative embodiment in FIG. 6), wall or other planar support element in the vehicle. For the embodiment shown, the tray attachment studs and wall attachment studs are opposite ends of a round bar stock element machined with grooves 311 for the modified I-beam shape and affixed in receiving apertures 312 in the mounting flange. An integral ACS conduit or aperture 314 is present in the flange for alignment with ACS conduit 210 in the tray rear boss.

Extending vertically from the mounting flange of the tray support and alignment element are positioning brackets 316a and 316b. Angle reliefs 318a and 318b in the brackets receive the lower portions of the rear side corners of the LRU box for enhanced positioning of the box to engage mating connectors 112 on the box with panel connectors 320 on the waffle panel. The combination of side rails 204 on the tray and angle the reliefs in the positioning brackets allows the LRU box to be set on the tray and slid rearward into precise mating engagement for the connectors. In alternative embodiments, the positioning brackets maintain the LRU rear wall in spaced relation from the waffle panel to allow manual interconnection of connector ended cables to mating connectors 112. Securing of the LRU box to the tray is accomplished by knurled engagement nuts 218 extending from an outboard end of the tray which are positioned over and tightened on engagement angles 114 on a front surface of the LRU box.

Figure 4:
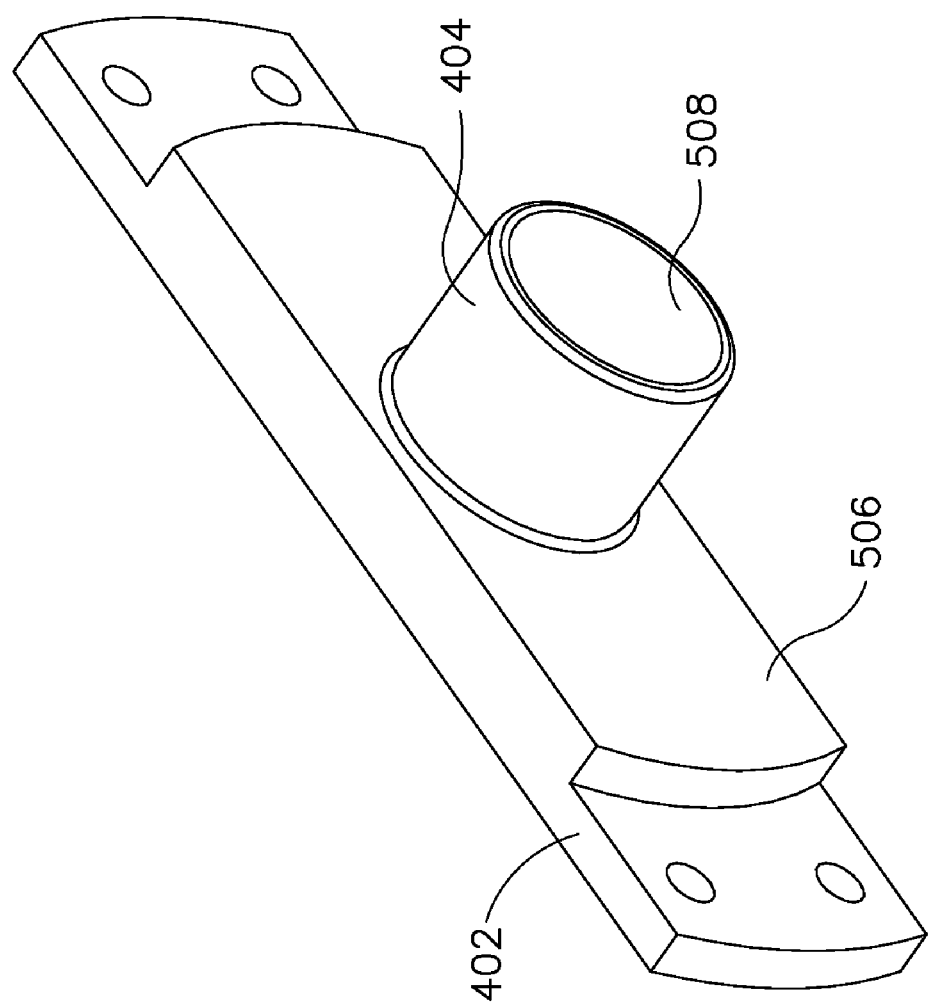
FIG. 4 is an isometric detail of the engagement backing plate for the support and alignment element and ACS; and, FIG. 5 is a flow chart showing the assembly method for the embodiment of FIGS. 1-4.

Securing of the tray to the tray support and alignment element for the embodiment shown in the drawings is accomplished with threaded fasteners 322 which extend through bores 324 in the flange to be received in threaded inserts 216 in the rear boss of the tray. With the tray attachment studs inserted in the receiving bores in the rear boss, the ACS conduit in the rear boss and the ACS aperture in the flange are automatically aligned. In certain embodiments, gasketing or gel sealants may be employed to seal the ACS elements for improved air flow. The tray support and alignment element is secured to the waffle panel with a backing plate 402 (shown in FIGS. 1 and 4) engaging wall attachment studs 308a and 308b which are inserted through mating holes in the waffle panel. For the embodiment shown in the drawings, the tray attachment studs and wall attachment studs are an integral element which are initially inserted through apertures in the panel and extend through the flange in the support and alignment element for insertion into the bores in the tray rear boss. The backing plate incorporates an ACS spud 404 aligned with aperture 314 in the flange for attachment of a flexible ACS conduit for distribution of cooling air from the vehicle ACS system. A hole in the waffle panel intermediate the mating holes for the studs provides a flow path for the ACS airflow from the spud to the ACS aperture in the backing plate.

Figure 5:
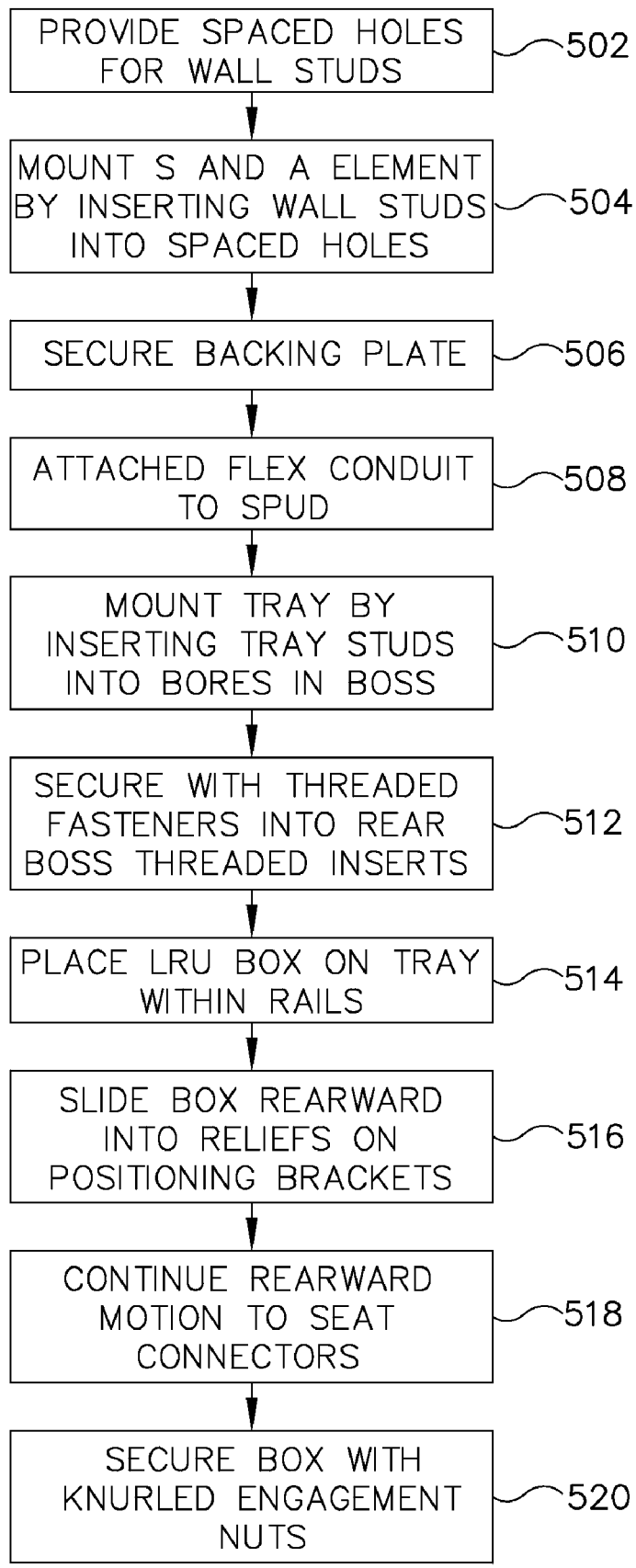

The embodiment disclosed provides a modular set of elements significantly simplifying the mounting of LRU boxes to support panels or structure within the vehicle. With the tray having a rear mounting boss, the tray support and alignment element with tray and wall mounting studs and the backing plate, each with integral ACS flow capability, mounting design within the vehicle requires only providing of spaced holes 502 to accommodate the wall attachment studs in the associated waffle panel or other mounting structure, as shown in FIG. 5. The tray support and alignment element is then mounted to the panel by insertion of the wall attachment studs through the spaced holes 504 and securing of the backing plate 506. A flexible ACS conduit is attached to the spud 508, if necessary, to supply cooling air for the LRU box. The tray can then be mounted at any time by merely inserting the tray attachment studs into the mating bores in the tray rear boss 510 and securing the threaded fasteners through the wall panel and flange into the threaded inserts in the rear boss 512. The tray is then ready to accept the LRU box. The LRU box is placed on the tray with the bottom corners engaged by the tray rails 514. The LRU box is then slid rearwardly for the lower portions of the rear edges of the box to be received by the angle reliefs in the positioning brackets urging the box into precise alignment for the connectors 516. Continued rearward motion seats the connectors 518 and the box is secured to the tray using the knurled engagement nuts secured over the engagement angles on the box 520. The components are partially or fully demounted in reverse order for an LRU which is not needed allowing volume in the avionics bay or other mounting location to be recovered. Additionally, trays of varying sizes can be swapped onto to the tray support and alignment element to accommodate alternative LRU boxes at the desired mounting location. The integrated ACS plenum and associated ACS conduits in the separate components avoids the requirements for separate ACS plumbing to the LRU box.

Figure 6:
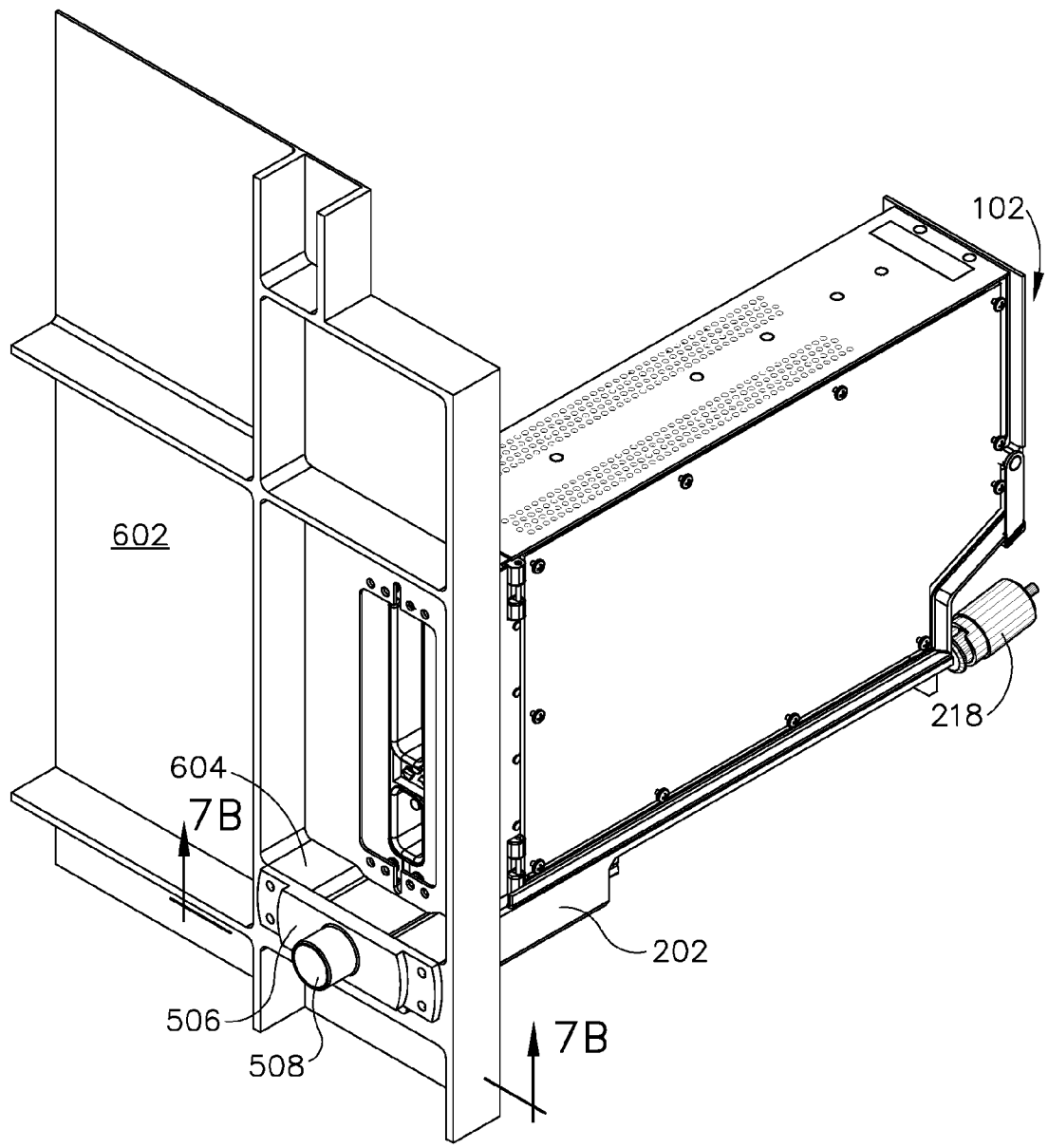
FIG. 6 is an isometric rear view of a first alternative embodiment of the invention.
Figure 7A:
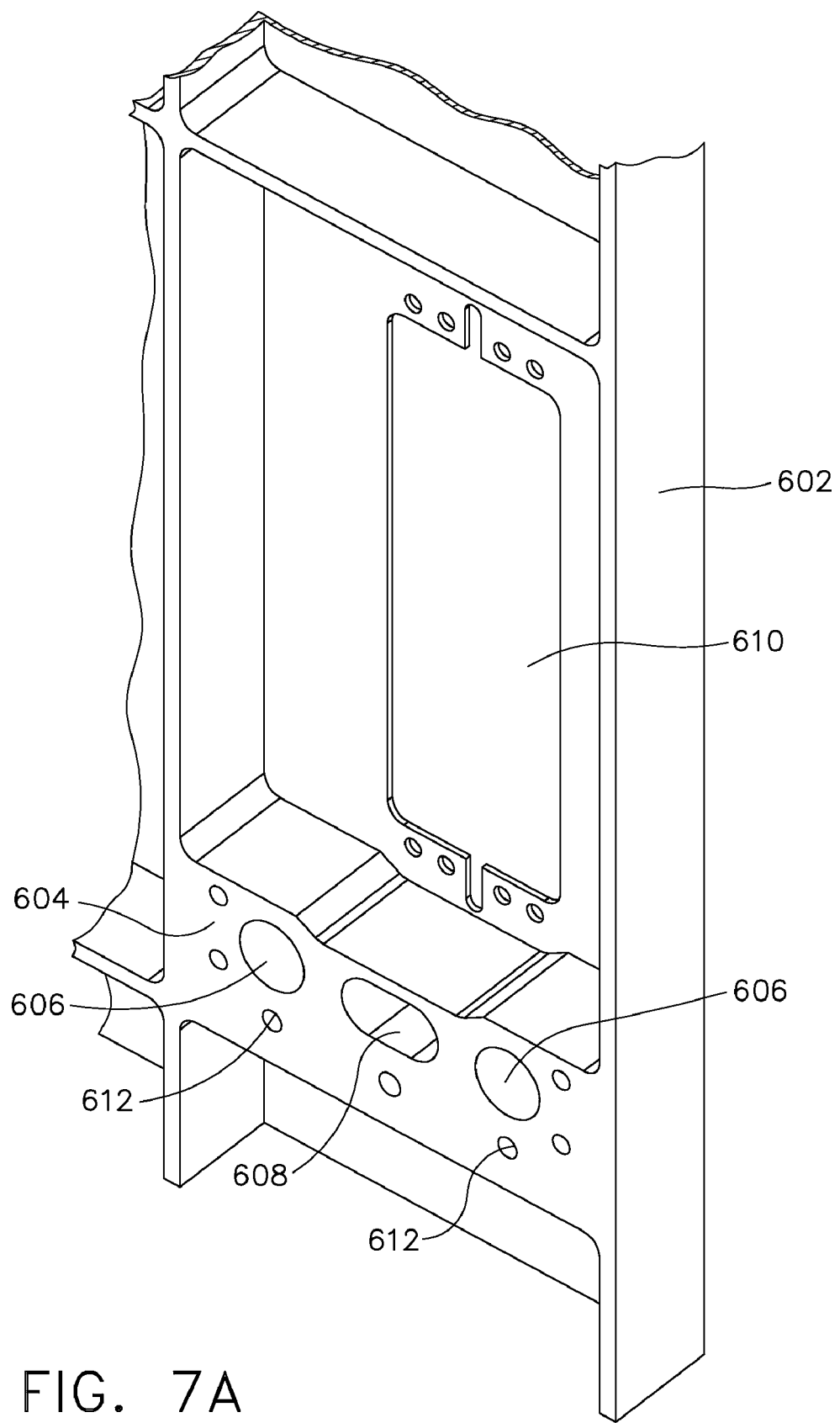
FIG. 7A is a rear isometric view of the waffle panel employed with the embodiment shown in FIG. 6.
Figure 7B:
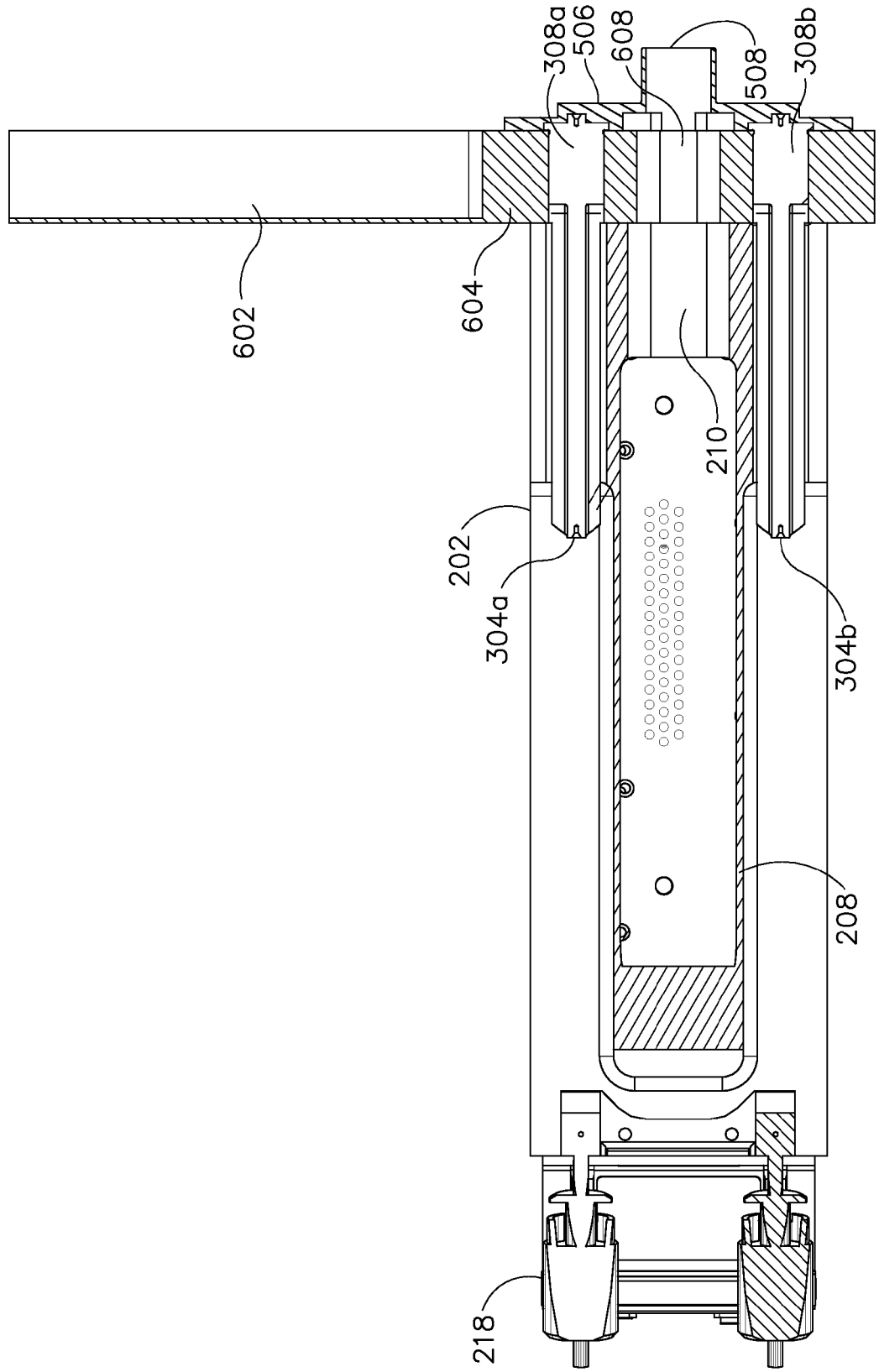
FIG. 7B is a bottom section view of the embodiment shown in FIG. 6.

An embodiment with further simplification of the structural elements is shown in FIG. 6. A waffle panel 602 on which the LRU shelf rack tray is to be mounted in a known location is machined with a support flange 604 integrated into the panel as shown in FIG. 7A and containing bores 606 to receive the wall attachment studs for mounting the tray. A separate support alignment element is therefore not required with the integrated flange providing the required rigidity for mounting of the tray and LRU. An ACS aperture 608 provides a flow path for cooling air and a connector cutout 610 allows access through the waffle panel for connection of electrical connectors to the LRU mounted on the shelf. As in the initial embodiment with the support and alignment element, the integrated flange in the waffle panel includes bores 612 for threaded fasteners to secure the tray to the flange. In alternative embodiments, the electrical connectors are fixedly mounted within the connector cutout for direct connection with the LRU when engaged with the shelf as previously described. A backing plate 506 and spud 508 are employed to secure the studs in the support flange as shown in FIG. 7B.

Figure 8A:
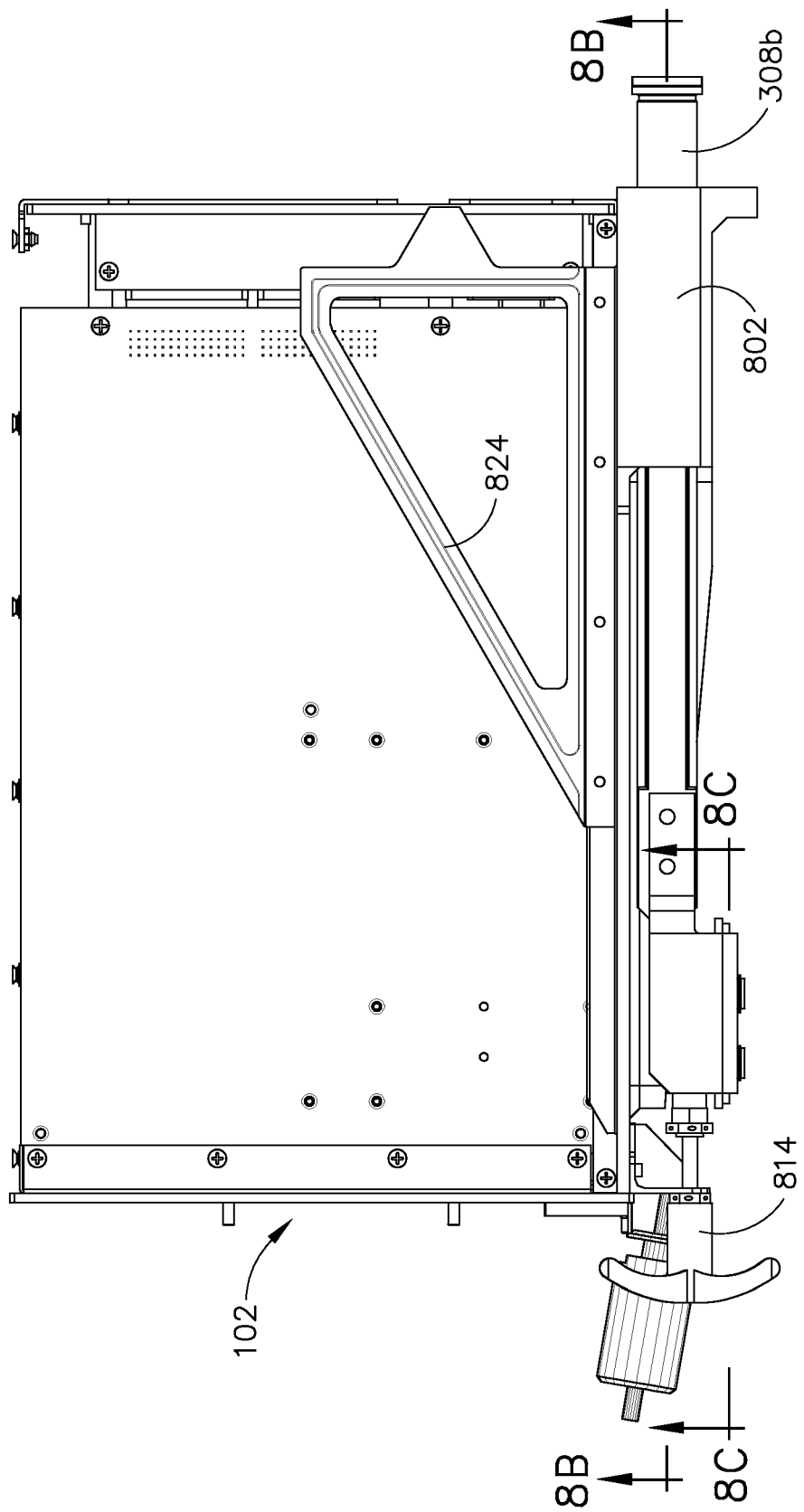
FIG. 8A is a side isometric view of a second alternative embodiment of the invention.
Figure 8B:
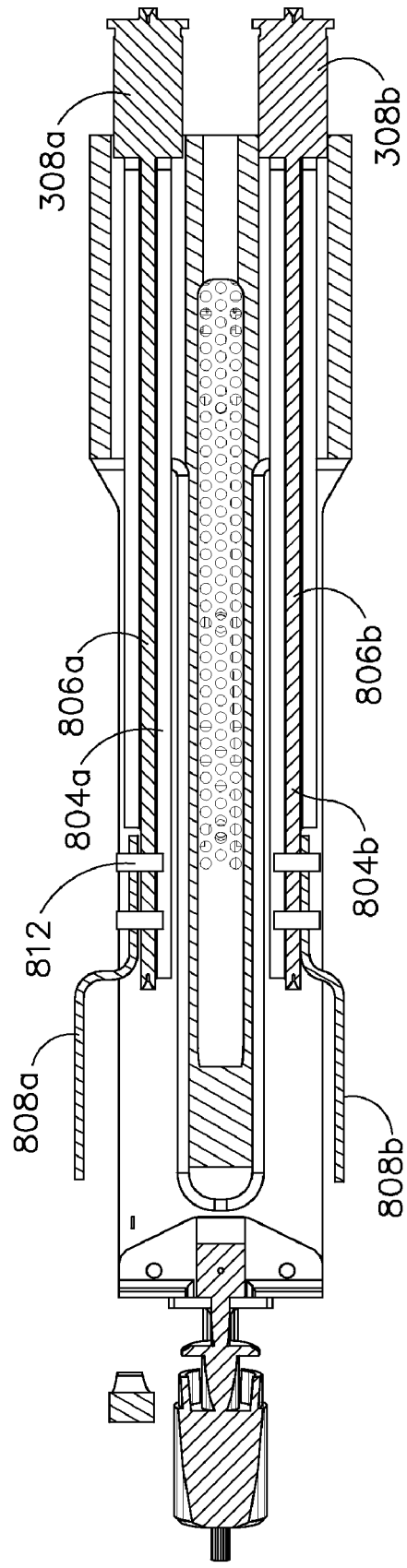
FIG. 8B is a bottom view of the embodiment of FIG. 8A.
Figure 8C:
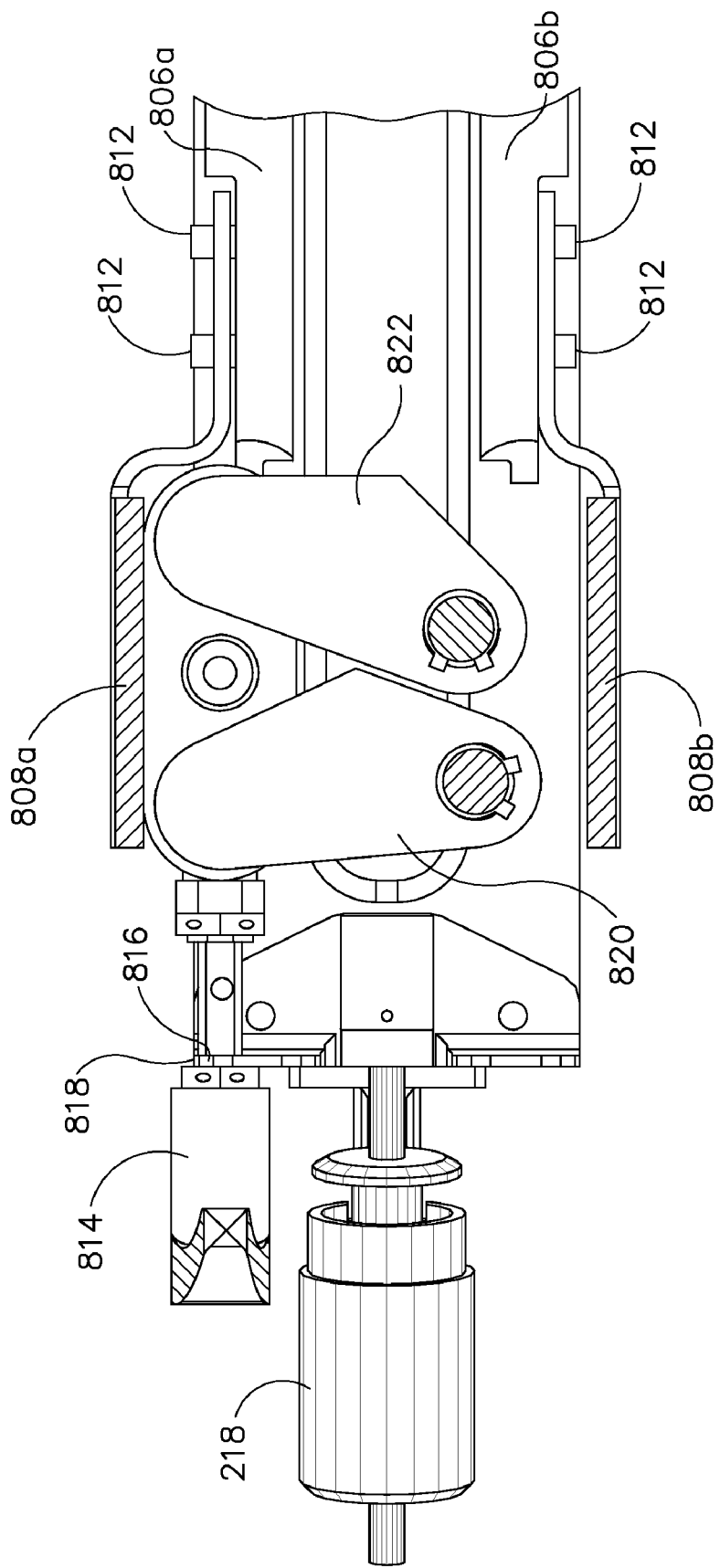
FIG. 8C is a partial section view showing the disengagement cam structure.

LRUs supportable by the embodiments disclosed herein vary in size, width and the size and density of connectors on the LRUs which will be engaged with mating connectors in or through the mounting surface may be sufficiently large that connection and particularly disconnection forces may exceed those which can be reasonably handled by assembly and maintenance technicians. An alternative embodiment shown in FIGS. 8A-C provides for use of the integral tray 802 for insertion and removal of the LRU onto the mounting surface such as the waffle panel described for the previous embodiment. Tray mounting studs 804a and 804b as best seen in FIG. 8B are extended and the receiving bores 806a and 806b respectively have greater length to further enhance alignment of the LRU mounted on the tray and the waffle panel mounted connectors.

A cam operated system allows mechanical leverage to be employed for removal of a mounted LRU with the tray. The extended mounting studs protrude from the receiving bores and cam reaction channels 808a and 808b are mounted to the protruding ends 810a and 810b using clips 812 or other suitable fasteners. T-handle 814 extends through an aperture 816 in a front panel 818 of the tray engaging cam operating plate 820 which upon drawing the T-handle away from the panel urges cooperating plate 822 into engagement with reaction channel 808a urging the tray outward along the studs. The extraction distance is sufficient for disconnection of the mated connectors on the LRU rear panel and the connectors in the waffle panel. The LRU may then be removed from the tray by operation of the knurled engagement nut 218 as previously described. Insertion of the LRU is accomplished with the tray extended on the studs. The LRU is placed on the tray and the knurled engagement nut secured. The LRU and tray are then urged toward the waffle panel to engage the mating connectors.

The embodiment described and shown in the drawings provides the additional benefit of employing the rigidity of the integral tray to supplement the LRU box structure during the insertion and removal process thereby providing additional stability for connector mating and demating as opposed to inserting or removing the LRU box directly.

The embodiment shown further provides positioning brackets 824 as for the initially described embodiment for vertical alignment of the LRU. This feature assists in alignment of the connectors particularly with an LRU configuration as shown in FIG. 8A with reduced width where a reduced base is available for stabilizing perpendicularity from the tray. However, with an integral flange in the waffle panel as disclosed in the embodiment of FIG. 7A, the positioning brackets extend from tray 802.

Figure 9:
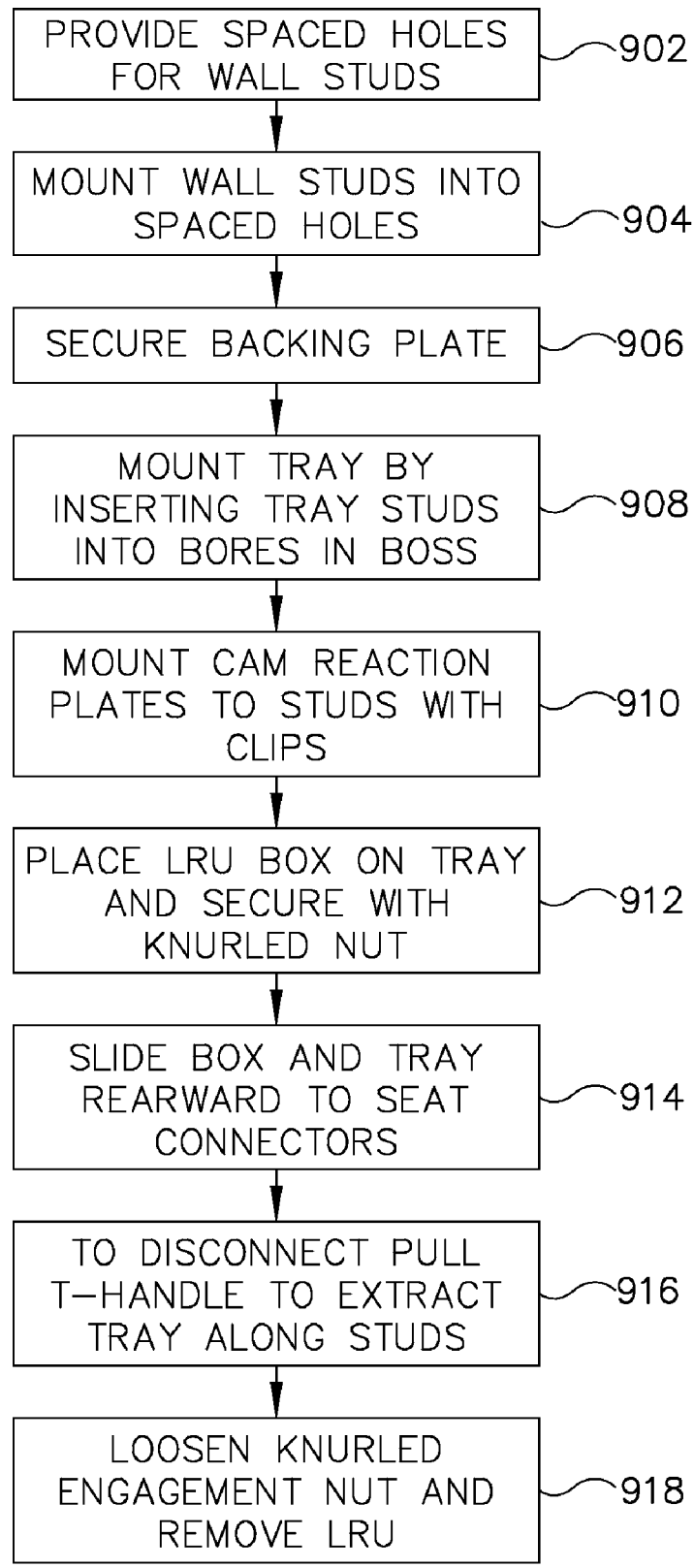
FIG. 9 is a flow chart showing the assembly method for the embodiment of FIGS. 8A-C

FIG. 9 demonstrates the mounting and demounting of an LRU using the embodiment of FIGS. 8A-C. The waffle panel is fabricated with an integrated support flange in which spaced holes are provided for the wall studs 902. The wall studs are mounted into the spaced holes 904 and are secured to the waffle panel with the backing plate 906. The tray is mounted by inserting the tray studs into the bores in the boss of the tray 908. Cam reaction plates are mounted to the distal ends of the tray studs using clips or comparable fasteners 910. The LRU box is placed on the tray and secured with the knurled nut 912. The box and tray are then slid rearward along the tray studs to seat the connectors in the LRU with mating connectors in the waffle panel 914. To disconnect the LRU, the T-handle is pulled engaging the cam elements to extract the tray along the studs disconnecting the mating connectors 916. The knurled nut(s) are then loosened and the LRU removed from the tray 918.

Figure 10:
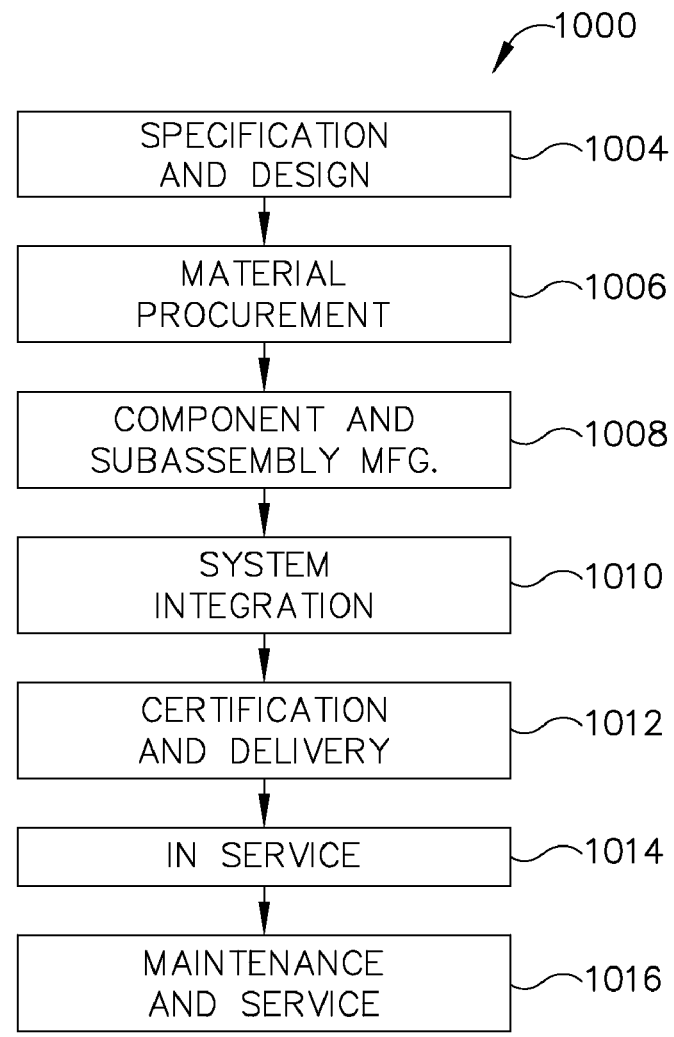
FIG. 10 is a flow chart of manufacturing and support processes in which the embodiments disclosed herein may be employed.
Figure 11:
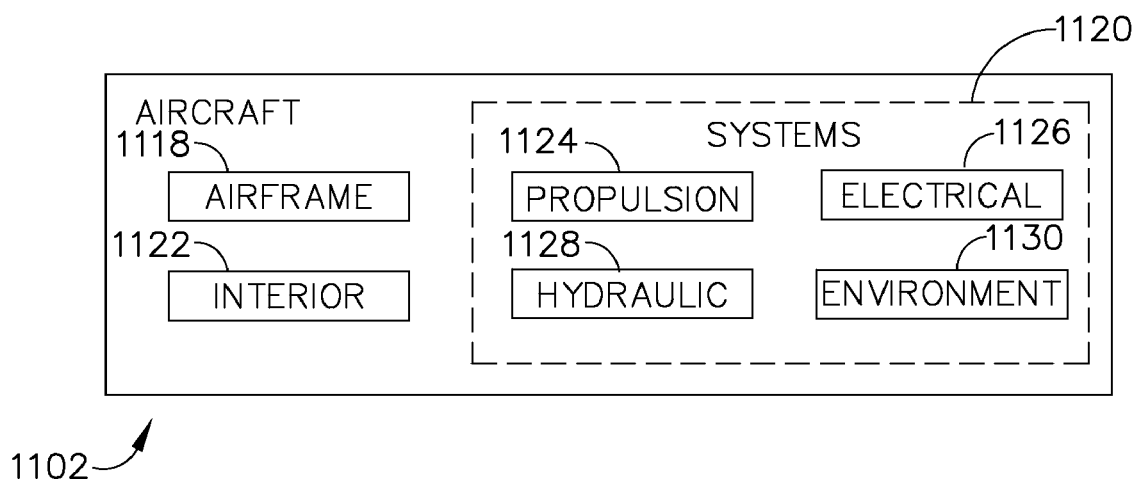
FIG. 11 is a block diagram of an exemplary aircraft system manufactured and supported using the methods of FIG. 10.

Referring more particularly to the FIGS. 10 and 11, embodiments of the LRU support system disclosed herein may be described in the context of an aircraft manufacturing and service method 1000 as shown in FIG. 10 and an aircraft 1102 as shown in FIG. 11. During pre-production, exemplary method 1000 may include specification and design 1004 of the aircraft and material procurement 1006. During production, component and subassembly manufacturing 1008 and system integration 1010 of the aircraft takes place. Thereafter, the aircraft may go through certification and delivery 1012 in order to be placed in service 1014. While in service by a customer, the aircraft 1002 is scheduled for routine maintenance and service 1016 (which may also include modification, reconfiguration, refurbishment, and so on).

Each of the processes of method 1000 may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

As shown in FIG. 11, the aircraft 1102 produced by exemplary method 1000 may include an airframe 1118 with a plurality of systems 1120 and an interior 1122. Examples of high-level systems 1120 include one or more of a propulsion systems 1124, an electrical and avionics system 1126, a hydraulic system 1128, and an environmental system 1130. Any number of other systems may be included. The LRUs supported by the embodiments disclosed herein may be a portion of the electrical and avionics system. Although an aerospace example is shown, the principles of the invention may be applied to other industries, such as the automotive industry.

Apparatus and methods embodied herein may be employed during any one or more of the stages of the production and service method 1000. For example, components or subassemblies corresponding to production process 1008 may be fabricated or manufactured in a manner similar to components or subassemblies produced while the aircraft 1102 is in service. Also, one or more apparatus embodiments, method embodiments, or a combination thereof may be utilized during the production stages 1008 and 1010, for example, by substantially expediting assembly of or reducing the cost of an aircraft 1102. Similarly, one or more of apparatus embodiments, method embodiments, or a combination thereof may be utilized while the aircraft 1102 is in service, for example and without limitation, to maintenance and service 1016.

Having now described various embodiments of the invention in detail as required by the patent statutes, those skilled in the art will recognize modifications and substitutions to the specific embodiments disclosed herein. Such modifications are within the scope and intent of the present invention as defined in the following claims.

What is claimed is:

1. A support system comprising:
   a unitary tray having a rear boss and an integral plenum, a conduit through the rear boss communicating with the plenum;
   a flange having an aperture;
   tray attachment studs extending from a front surface of the flange, wall attachment studs extending from a rear surface of the flange, and the wall attachment studs received in spaced holes in a mounting structure and the tray attachment studs received in bores in the rear boss, insertion of the tray attachment studs in said bores aligning the conduit in the rear boss and the aperture in the flange.

2. The support system as defined in claim 1 further comprising:

a backing plate engaging the wall attachment studs to secure the attachment studs to the mounting structure, the backing plate having an spud aligned with the aperture.

3. The support system as defined in claim 1 wherein the tray includes rails on side edges thereof to engage bottom edges of an LRU box supported by the tray.

4. The support system as defined in claim 1 further comprising positioning brackets extending vertically with respect to the tray and having reliefs to engage vertical rear edges of an LRU box supported by the tray, said reliefs urging the box into precise alignment for engagement of connectors on the box and mounting structure.

5. The support system as defined in claim 4 wherein the flange is incorporated in a tray support and alignment element and the positioning brackets extend from the support and alignment element.

6. The support system as defined in claim 1 wherein mounting structure comprises a waffle panel and the flange is machined integral to the waffle panel.

7. The support system as defined in claim 1 wherein the each of the tray attachment studs and the wall attachment studs are machined from opposing ends of a single bar.

8. A method for mounting Line Replaceable Units (LRU) comprising the steps of:

providing a tray having a rear mounting boss;
providing a tray support and alignment element with tray and wall attachment studs;
providing a backing plate;
providing spaced holes to accommodate the wall attachment studs in an associated mounting structure;
inserting the wall attachment studs into the spaced holes;
securing the backing plate to the wall attachment studs;
mounting the tray by inserting the tray attachment studs into mating bores in the tray rear boss;
securing the tray with threaded fasteners through the flange into threaded inserts in the rear boss;
placing an LRU box on the tray with the bottom corners engaged by rails on the tray; and,
sliding the LRU box rearwardly for the lower portions of the rear edges of the box to be received by angle reliefs in positioning brackets on the tray urging the box into precise alignment for engaging connectors.

9. The method as defined in claim 8 wherein the tray incorporates an integral Air Cooling System (ACS) plenum and the rear boss and tray support and alignment element each have an ACS conduit and further comprises the step of attaching a flexible ACS conduit to a spud on the backing plate to supply cooling air for the LRU box.

10. The method as defined in claim 8 wherein the step of sliding includes continued rearward motion to seats the connectors; and further comprising the step of securing the box to the tray using the knurled engagement nuts secured over the engagement angles on the box.

11. An aircraft incorporating Line Replaceable Units (LRU), the aircraft in part comprising:

at least one bulkhead as a mounting structure;

at least one unitary tray having a rear boss and an integral Air Cooling System (ACS) plenum, an ACS conduit through the rear boss communicating with the plenum, at least one tray support and alignment element having
a flange with tray attachment studs extending from a front surface thereof,
wall attachment studs extending from a rear surface thereof and
an ACS aperture, the wall attachment studs received in spaced holes in the mounting structure and the tray attachment studs received in bores in the rear boss, insertion of the tray attachment studs aligning the ACS conduit in the rear boss and the ACS aperture in the flange.

12. The aircraft as defined in claim 11 further comprising:

a backing plate engaging the wall attachment studs to secure the tray support and alignment element to the mounting structure, the backing plate having an ACS spud aligned with the ACS aperture.

13. The aircraft as defined in claim 11 wherein the tray includes rails on side edges thereof to engage bottom edges of an LRU box supported by the tray.

14. The aircraft as defined in claim 11 wherein the tray support and alignment element further includes positioning brackets extending vertically from the flange and having reliefs to engage vertical rear edges of an LRU box supported by the tray, said reliefs urging the box into precise alignment for engagement of connectors on the box and mounting structure.

15. An aircraft incorporating Line Replaceable Units (LRU), the aircraft in part comprising:

a unitary tray having a rear boss and an integral plenum, a conduit through the rear boss communicating with the plenum;
a flange having an aperture;
tray attachment studs extending from a front surface of the flange,
wall attachment studs extending from a rear surface of the flange, and
the wall attachment studs received in spaced holes in a mounting structure and the tray attachment studs received in bores in the rear boss, insertion of the tray attachment studs in said bores aligning the conduit in the rear boss and the aperture in the flange.

16. The aircraft as defined in claim 15 further comprising:

a backing plate engaging the wall attachment studs to secure the attachment studs to the mounting structure, the backing plate having an spud aligned with the aperture.

17. The aircraft as defined in claim 15 wherein the tray includes rails on side edges thereof to engage bottom edges of an LRU box supported by the tray.

18. The aircraft as defined in claim 15 further comprising positioning brackets extending vertically with respect to the tray and having reliefs to engage vertical rear edges of an LRU box supported by the tray, said reliefs urging the box into precise alignment for engagement of connectors on the box and mounting structure.

19. The aircraft as defined in claim 18 wherein the flange is incorporated in a tray support and alignment element and the positioning brackets extend from the support and alignment element.

20. The aircraft as defined in claim 15 wherein mounting structure comprises a waffle panel and the flange is machined integral to the waffle panel.

* * * * *